US009450583B2

(12) United States Patent
Zhang et al.

(10) Patent No.: US 9,450,583 B2
(45) Date of Patent: Sep. 20, 2016

(54) INPUT/OUTPUT CIRCUIT WITH HIGH VOLTAGE TOLERANCE AND ASSOCIATED APPARATUS

(75) Inventors: Yao-Zhong Zhang, Shanghai (CN); Ju-Ming Chou, Hsinchu County (TW); Chih-Tien Chang, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 13/225,718

(22) Filed: Sep. 6, 2011

(65) Prior Publication Data
US 2012/0056665 A1    Mar. 8, 2012

(30) Foreign Application Priority Data
Sep. 6, 2010    (TW) ................................ 99130087 A

(51) Int. Cl.
*H03K 17/687*    (2006.01)
*H03K 19/0185*   (2006.01)

(52) U.S. Cl.
CPC ........................ *H03K 19/018507* (2013.01)

(58) Field of Classification Search
CPC ........ G05F 3/205; G05F 3/24; H02M 3/073; G11C 5/145; H03K 5/08; H03K 17/0822; H03K 19/00315; H03G 11/002
USPC ....... 327/537, 327, 328, 331, 306, 309, 315, 327/427; 361/90, 90.1, 90.5
See application file for complete search history.

(56) References Cited

U.S. PATENT DOCUMENTS

| | | | | |
|---|---|---|---|---|
| 5,808,502 A | * | 9/1998 | Hui et al. | 327/333 |
| 5,907,484 A | * | 5/1999 | Kowshik et al. | 363/60 |
| 7,012,592 B2 | * | 3/2006 | Richards | 345/92 |
| 7,382,159 B1 | * | 6/2008 | Baker | 326/83 |

FOREIGN PATENT DOCUMENTS

JP    2009284689    12/2009

OTHER PUBLICATIONS

Paul Li, Hot-Plug and Hot-Swap Bus Switches, Jun. 13, 2002, Pericom Semiconductor Corporation, p. 2.*
Graves, Christopher, et al., "CBT-C, CB3T, and CB3Q Signal-Switch Families", Jul. 2003, Texas Instruments Incorporated, pp. 4-22.*
Li, Paul, Hot-Plug and Hot-Swap Bus Switches, Jun. 13, 2002, Pericom Semiconductor Corporation, p. 2.*
"An Introduction to Fairchild Switch Products", Dec. 2000, Fairchild Semiconductor Corporation, pp. 1-4.*
Taiwan Patent Office, Office Action issued on Jun. 18, 2013.

* cited by examiner

*Primary Examiner* — Lincoln Donovan
*Assistant Examiner* — Thomas Skibinski
(74) *Attorney, Agent, or Firm* — WPAT, PC; Justin King; Douglas A. Hosack

(57) ABSTRACT

An input/output (IO) circuit with high voltage tolerance is provided. In an integrated circuit, the IO circuit includes a charge pump for generating a bias voltage higher than an internal operating voltage of the charge pump itself, and a switch between an external circuit and an internal circuit of the integrated circuit. When the switch conducts between the external circuit and the internal circuit, the switch provides a clamping voltage according to the bias voltage and a cross voltage of the switch, so that a voltage of the internal circuit is bounded by the clamping voltage to prevent the internal circuit from over-voltage.

15 Claims, 2 Drawing Sheets

INPUT/OUTPUT CIRCUIT WITH HIGH VOLTAGE TOLERANCE AND ASSOCIATED APPARATUS

This application claims the benefit of Taiwan application Serial No. 99130087, filed Sep. 6, 2010, the subject matter of which is incorporated herein by reference.

BACKGROUND OF THE INVENTION

1. Field of the Invention

The invention relates in general to an input/output (IO) circuit with high voltage tolerance and associated apparatus, and more particularly to an IO circuit with high voltage tolerance and associated apparatus that avoids external high voltage by a clamping voltage provided by an internal switch circuit and a charge pump.

2. Description of the Related Art

Electronic devices are the most crucial hardware foundation of the modern information society. In an electronic device, multiple integrated circuits of different functions are disposed on a printed circuit, which facilitates signal transfer between the integrated circuits to accomplish overall function. To achieve such overall function, there is a need that different integrated circuits transfer data signals without interfering one another.

Certain integrated circuits, by being operated at a lower operating voltage and correspondingly having lower power consumption as well as operating temperature to meet power saving purposes, are extensively applied in various electronic devices. However, conventional low-voltage integrated circuits are also compromised by a lower voltage tolerance. During signal transfer between a low-voltage integrated circuit and a high-voltage integrated circuit via a printed circuit, in addition to noises and surges induced by the printed circuit, the low-voltage integrated circuit is prone to damages resulted from the relatively higher voltage of the high-voltage integrated circuit. For example, suppose an integrated circuit operates at 2.5V. During signal transfer between the 2.5V integrated circuit and another integrated circuit operating at 3.3V, the normal signal voltage of the 3.3V integrated reaches as high as 3.3V while noises of the printed circuit may be 0.3V to result an accumulated voltage of 3.6V, which exceeds the tolerable voltage of the 2.5V integrated circuit, such that the 2.5V integrated circuit malfunctions or even becomes damaged due to the external high voltage.

When the high-voltage integrated circuit is directly coupled to the low-voltage integrated circuit, signal errors and even more severe circuit damage may be incurred, and so a level shifter is interfaced between the two integrated circuits. However, the level shifter adds not only extra cost in hardware and assembly but also power consumption.

SUMMARY OF THE INVENTION

The invention is directed to an input/output (IO) circuit with high voltage tolerance and associated apparatus applicable to a low operating voltage integrated circuit. By utilizing an internal switch circuit and a charge pump, a voltage at a signal transfer interface of the integrated circuit is bounded by a clamping voltage to prevent undesirable effects of any external high voltage/over-voltage, so that the integrated circuit is given a higher voltage tolerance.

According to the present invention, an IO circuit provided in an integrated circuit comprises a charge pump and a switch circuit. The charge pump generates a bias voltage Vg. The switch circuit comprises a first end coupled to an external signal, a second end coupled to the charge pump, and a third end coupled to an internal circuit. When the switch circuit conducts between the first end and the third end, the switch circuit provides a first predetermined cross voltage Vth between the second end and the third end, and then provides a clamp voltage range (between a clamping voltage and a ground voltage) between the bias voltage Vg and the predetermined cross voltage Vth to limit the voltage of the third end within the clamp voltage range. The voltage of the third end is bounded below the clamping voltage.

The switch circuit determines an upper limit of the clamp voltage range according to a difference between the bias voltage Vg and the cross voltage Vth. That is, the upper limit is the clamping voltage, which is the difference between the bias voltage and the cross voltage (Vg−Vth). The charge pump and the internal circuit both operate within an internal operating voltage range (e.g., a range between the internal operating voltage Vcc and the ground voltage), and the bias voltage Vg is higher than the upper limit of the internal operating level range; more specifically, the bias voltage Vg is higher than the internal operating voltage Vcc. Accordingly, the clamping voltage range is also higher than the internal operating voltage range; more specifically, the clamping voltage (Vg−Vth) is higher than the internal operating voltage Vcc. Since the tolerable voltage during integrated circuit fabrication process is higher than the internal operating voltage, the clamping voltage also is higher than the internal operating circuit to fully utilize the remaining tolerance contributed by the fabrication process. For example, an internal circuit of a 2.5V integrated circuit is generally 3.3V tolerant, and thus clamping voltage may be 3.3V, which is higher than the internal operating voltage of 2.5V of the integrated circuit.

For example, the switch circuit is a transistor such as an N-channel metal-oxide-semiconductor (NMOS) transistor, the first, second and third ends of the switch circuit are respectively the drain, gate and source of the transistor, and the cross voltage Vth is the threshold voltage of the transistor. When the switch circuit conducts between the first end and the third end, supposing the voltage of the first end falls within the clamping voltage range (not exceeding the clamping voltage (Vg−Vth)), the switch causes the voltages of the third and first ends follow each other. When the voltage of the first end goes beyond of the clamping level range, the switch circuit maintains the voltage of the third level within the clamping voltage range such that the voltage of the third end is bounded by the clamping voltage.

The present invention further discloses an integrated circuit with a low operating voltage, wherein an internal circuit of the integrated circuit is coupled to an external signal from an external circuit via a first end of a switch circuit. For example, the external circuit is an integrated circuit operating at a high voltage higher than a clamping voltage range. The integrated circuit with a low operating voltage is applicable as a signal input or output interface, and more particularly as a bidirectional IO interface. The internal circuit outputs signals to the first end via the switch circuit, and receives signals transmitted to the first end to the internal circuit via the switch circuit.

The above and other aspects of the invention will become better understood by the following description of the embodiments. The following description is made with reference to the accompanying drawings.

DETAILED DESCRIPTION OF THE INVENTION

Figure 1:
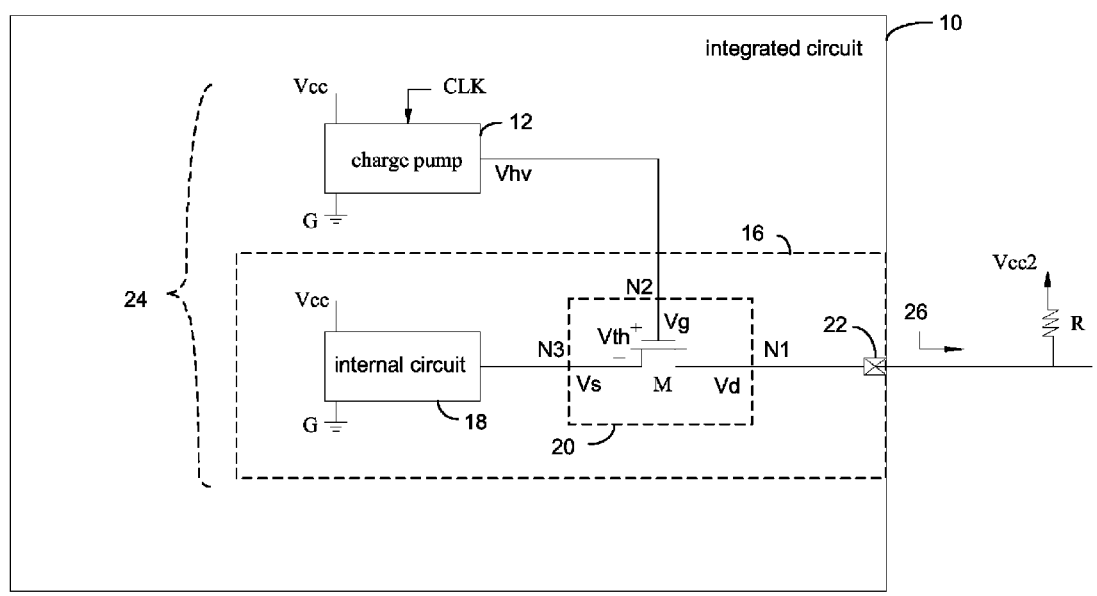
FIG. 1 is a schematic diagram of a high voltage tolerance input/output (IO) circuit according to an embodiment of the present invention.

FIG. 1 shows a circuit diagram of an IO circuit 24 applied to an integrated circuit 10 according to an embodiment of the present invention. The IO circuit 24 comprises a charge pump 12 and a pad circuit 16. For example, the pad circuit 16 is an IO cell. The charge pump 12 operates between an internal operating voltage Vcc and a ground voltage G, that is, within an internal operating level range. In this embodiment, upper and lower limits of the internal operating level range are determined by the internal operating voltage Vcc and the ground voltage G. The charge pump 12 generates a voltage Vhv that is higher than the internal operating voltage to serve as a bias voltage Vg according to the internal operating voltage Vcc provided by the internal operating level range. For example, the charge pump 12 comprises a capacitor, a switch and a diode (not shown), and is triggered by a clock Clk to generate an accumulated voltage Vhv that is higher than the internal operating voltage Vcc.

For example, the pad circuit 16 comprises a switch circuit 20 and an internal circuit 18. The switch circuit 20 has its first end (node N1) coupled to an external circuit 26 via a pad 22, its second end (node N2) coupled to the charge pump 12 to receive the bias voltage Vg from the charge pump 12, and its third end (node N3) coupled to the internal circuit 18. In this embodiment, the switch circuit 20 can be an N-channel metal-oxide semiconductor (NMOS) transistor M, which has its gate receiving the bias voltage Vg at the node N2, its drain coupled to the node N1 and its source coupled to the node N3. The internal circuit 18 receives the internal operating voltage Vcc and the ground voltage G to operate accordingly. For example, in order to transfer signals with the external circuit 26, the internal circuit 18 comprises a signal buffer, an amplifier, a gain adjusting circuit, a level shifter, an impedance matching circuit, an equalizer and/or an ESD protection circuit (not shown), so as to serve as a signal transfer interface between the integrated circuit 10 and the external circuit 26. Apart from the internal circuit 18, the pad circuit 16, for example, also comprises other circuits operating at different internal operating level ranges, e.g., an auxiliary circuit (not shown) operating at a voltage lower than the internal operating circuit Vcc. The auxiliary circuit may be coupled to the internal circuit 18 to control signal transfer of the internal circuit 18.

In the example shown in FIG. 1, a resistor R connected to an external operating voltage Vcc2 represents an equivalent circuit for the external circuit 26, to operate at a voltage range between the external operating voltage Vcc2 and the ground voltage G. For example, the external circuit 26 is a circuit or another integrated circuit on a printed circuit. Supposing the external operating voltage Vcc2 is higher than the internal operating voltage Vcc of the integrated circuit 10, the interface between the integrated circuit 10 and the external circuit 26 needs an over-voltage protection mechanism to prevent a high voltage / over-voltage of the external circuit 26 from damaging the integrated circuit 10. In the I0 circuit 24, the protection mechanism is realized by the charge pump 12 and the switch circuit 20 in the pad circuit 16 cooperating between the nodes N1 and N3.

A voltage Vd is established at the node N1 by external signals of the external circuit 26, and the switch circuit 20 is coupled between the external circuit 26 and the internal circuit 18. When the switch circuit 20 conducts between the nodes N1 and N3, the switch circuit 20 provides a cross voltage Vth between the nodes N2 and N3, and provides a clamping voltage range according to the bias voltage Vg provided by the charge pump 12 and the cross voltage Vth to limit the voltage at the node N3 (e.g., the voltage Vs) within the clamping voltage range to protect the internal circuit 18.

In the embodiment shown in FIG. 1, for example, when the transistor M is conducted, the cross voltage Vth can be a threshold voltage, or a cross voltage between the gate and the source. Since the gate voltage of the transistor M is a predetermined bias voltage provided by the charge pump 12, the cross voltage Vth is a constant parameter of the transistor M. Therefore, when the transistor M is conducted, the voltage Vs at the node N3 is bounded with the clamping voltage (Vg–Vth). In the event that over-voltage of the external circuit 26 is reflected at the node N1 to result an increase in the voltage Vd, the voltage Vs at the node N3 of the internal circuit 18 is kept at the clamping voltage (Vg–Vth). In other words, upper and lower limits of the clamping voltage range are determined by the clamping voltage (Vg–Vth) and the ground voltage G. When the switch circuit 20 conducts the nodes N1 and N3, supposing the level (the voltage Vd) falls with the clamping level range, that is, when the voltage Vd is smaller than the clamping voltage (Vg–Vth), the switch circuit 20 causes the voltages at the nodes N3 (the voltage Vs) and N1 to follow each other, so that normal signal transfer between the internal circuit 18 and the external circuit 26 is achieved. Further, when the voltage at the node N1 falls beyond the clamping voltage range, that is, when the voltage Vd is higher than the clamping voltage (Vg–Vth), the conducted switched circuit 20 maintains the voltage at the node N3 within the clamping voltage range, such that the voltage Vs is maintained at the clamping voltage (Vg–Vth).

Figure 2:
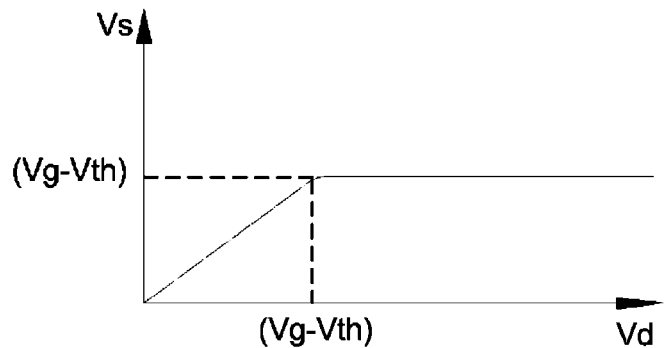
FIG. 2 is a diagram depicting a voltage curve when the circuit in FIG. 1 is in operation.

Based on the operation described above, a relationship between the voltage Vs and the voltage Vd is illustrated in FIG. 2. As shown, when the voltage Vd at the node N1 (FIG. 1) is below the clamping voltage (Vg–Vth), the switch circuit 20 causes the voltage Vs at the node 3 to follow the voltage Vd; when the voltage Vd exceeds the clamping voltage (Vg–Vth), indicating that the integrated circuit 10 is being struck by an over-voltage, the switch circuit 20 maintains the voltage Vs of the internal circuit 18 at the clamping voltage (Vg–Vth) to thereby protect the internal circuit 18. For example, the clamping voltage (Vg–Vth) is higher than the internal operating voltage Vcc but smaller than or equal to the tolerable voltage of the integrated circuit 10.

In this embodiment, to establish a protection mechanism between the IO circuit 24 operating at an internal operating voltage of 2.5V and the external circuit 26 operating at 3.3V, 3.3V (or a lower voltage between 3.3V and 2.5V) may be set as a target value of the clamping voltage since a 2.5V circuit is generally 3.3V tolerant. It should be noted that the clamping voltage is (Vg–Vth), and the cross voltage Vth when the transistor M is conducted is 0.7V. The bias voltage Vg is determined by the clamping voltage target value plus the cross voltage Vth, that is, 3.3V+0.7V=4.0V. Preferably, a charge pump 12 providing a 4V bias voltage Vg is applied along with the switch circuit 20 to realize the 3.3V clamping voltage of the pad circuit 16.

Figure 3:
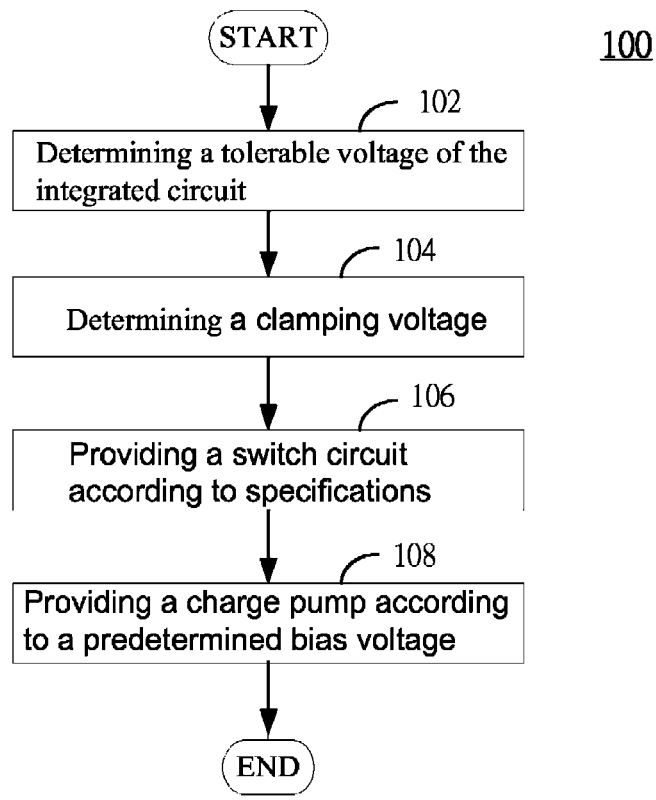
FIG. 3 is a flowchart of the IO circuit with high voltage tolerance according to an embodiment of the present invention.

Furthermore, a method of realizing, an integrated circuit, including design/manufacture/production, according to one embodiment of the invention, is shown in a flow 100 of FIG. 3. In Step 102, a tolerable voltage of the integrated circuit is determined according to fabrication techniques and parameters of the integrated circuit. In Step 104, a predetermined target value of the clamping voltage Vcmp is set according to the tolerable voltage of the integrated circuit. Preferably, the predetermined target value is the tolerable voltage of the integrated circuit, or a value between the tolerable voltage and the internal operating voltage. In Step 106, a switch circuit is provided according to specifications (e.g., frequency and speed) of a desired signal transfer interface, and a cross voltage Vth provided by the switch circuit is obtained according to operation parameters of the switch circuit. In Step 108, a charge pump is rendered according to a bias voltage Vg provided by the charge pump based on Vg=Vcmp+Vth.

The present invention is applicable to signal input or output interface of an integrated circuit, and more particularly suitable for a bidirectional IO interface. When being applied as a signal input interface, the internal circuit is 18 receives signals from the external circuit 26. When being applied as a signal output interface, the pad circuit 16 is an IO cell that transmits signals. When being applied as a bidirectional IO interface, the pad circuit 16 is a bidirectional IO cell; more specifically, the internal circuit 18 transmits signals to the first end (the node N1) via the switch circuit 20 and receives signals transmitted to the node N1 to the internal circuit 18 via the switch circuit 20. Further, when the present invention is applied to certain integrated circuits such as radio frequency (RF) integrated circuits or flash memory control circuits that need a built-in charge pump, the charge pump built-in these certain integrated circuits is utilized to provide the required bias voltage Vg.

The integrated circuit 10 according to the present invention may be provided with a plurality of pad circuits 16. The switch circuits 20 in the pad circuits 16 are coupled to the same charge pump 12, so as to respectively establish the protection mechanism disclosed by the present invention in the pad circuits 16. Further, to allow the integrated circuit 10 to transfer signals with multiple external circuits with different operating voltages, signal transfer interfaces of the external circuits may be individually provided with a corresponding charge pump 12 and a corresponding switch circuit 20. Alternatively, the integrated circuit 10 may be provided with an appropriate voltage conversion mechanism, which converts a voltage from a same charge pump to bias voltages needed by different signal transfer interfaces to accommodate the switch circuits of such signal transfer interfaces in order to realize the protection mechanism disclosed by the present invention.

With the description of the embodiments above, it is appreciated that the present invention adopts a charge pump for generating a bias voltage higher than an internal operating voltage, and establishes in conjunction with a cross voltage a clamping voltage higher than the internal operating voltage. Thus, normal signal transfer between an integrated circuit operating at a lower internal operating voltage and an external circuit operating at a higher voltage is ensured while also preventing undesirable effects of over-voltage, so that integrated circuits with different operating voltages are able to yield a consolidated overall function. Further, the present invention is capable of preventing an ESD protection mechanism of the integrated circuit from being mistakenly triggered by an external high voltage. The built-in charge pump of the integrate circuit according to the present invention has lower hardware cost as well as minimal power consumption.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An input/output (IO) circuit with an internal operating voltage for interfacing with an external circuit providing an external signal at an external operating voltage, comprising:
   a voltage generator, generating a bias voltage higher than said internal operating voltage and less than or equal to a sum of a maximum tolerable voltage and a pre-determined cross voltage; and
   a switch circuit, with said pre-determined cross voltage, for conditioning said external signal to an internal signal at a clamping voltage based on said bias voltage, comprising:
      a first end, for receiving said external signal at said external operating voltage;
      a second end, coupled to the voltage generator for receiving said bias voltage; and
      a third end, coupled to an internal circuit with said maximum tolerable voltage, and to provide said internal signal at said clamping voltage to said internal circuit;
   wherein said clamping voltage is larger than said internal operating voltage and less than or equal to said maximum tolerable voltage, and said internal circuit is on a same chip as the IO circuit.

2. The IO circuit according to claim 1, wherein the voltage generator operates at the internal operating voltage.

3. The IO circuit according to claim 1, wherein the switch circuit is a transistor, the first end, the second end and the third end are respectively a drain, a gate and a source of the transistor; and
   the predetermined cross voltage is a threshold voltage of the transistor.

4. The IO circuit according to claim 1, wherein when the switch circuit conducts between the first end and the third end, the switch circuit causes a voltage of the third end to follow a voltage of the first end when the voltage of the first end within the clamping voltage range, and maintains the voltage of the third end at an upper limit of said clamping voltage range when the voltage of the first end is higher than the clamping voltage range.

5. The IO circuit according to claim 1, wherein said external operating voltage exceeds the clamping voltage.

6. The IO circuit according to claim 1, wherein the bias voltage is set higher than said maximum tolerable voltage of said IO circuit.

7. The IO circuit according to claim 1, wherein said internal circuit further comprises a signal buffer.

8. The IO circuit according to claim 1, wherein said internal circuit further comprises an amplifier.

9. The IO circuit according to claim 1, wherein said internal circuit further comprises a gain adjusting circuit.

10. The IO circuit according to claim 1, wherein said internal circuit further comprises an impedance matching circuit.

11. The IO circuit according to claim 1, wherein said internal circuit further comprises an equalizer.

12. The IO circuit according to claim 1, wherein said internal circuit further comprises an electrostatic discharge protection circuit.

13. A method of protecting an integrated circuit with an internal operating voltage interfacing with an external circuit providing an external signal at an external operating voltage, wherein said internal operating voltage is lower than said external operating voltage, comprising:
- determining a maximum tolerable voltage for said integrated circuit, wherein the internal circuit will be damaged if it operates above said maximum tolerable voltage, and said maximum tolerable voltage is above and outside of said internal operating voltage;
- providing a switch circuit, with a predetermined cross voltage for conditioning said external signal to an internal signal at a clamping voltage, comprising:
  - a first end, coupled to said external signal;
  - a second end; and
  - a third end, coupled to said integrated circuit;
- providing a voltage generator, coupled to said second end; and
- configuring said voltage generator to deliver a bias voltage to said second end for limiting a current voltage between said first end and said third end to no higher than said clamping voltage range, and said bias voltage is set to less than or equal to a sum of said predetermined cross voltage and said maximum tolerable voltage; and
- wherein said clamping voltage is less than or equal to said maximum tolerable voltage, and said clamping voltage is larger than said internal voltage.

14. The method of protecting an integrated circuit according to claim 13, wherein said switch circuit is a transistor, said first end is a drain, said second end is a gate, and said third end is a source.

15. An input/output (TO) system, comprising:
- an internal operating voltage source, supplying an internal operating voltage;
- an internal circuit, powered by said internal operating voltage source, with a maximum tolerable voltage exceeding said internal operating voltage, and below an external operating voltage;
- a voltage generator, powered by said internal operating voltage source; and
- an nMOS transistor with a pre-determined cross voltage, for conditioning an external signal at said external operating voltage to an internal signal at a clamping voltage, comprising:
  - a drain, connecting said external signal at said external operating voltage;
  - a source, providing said internal signal at said clamping voltage to said internal circuit based on said external signal; and
  - a gate, for receiving a bias voltage from said charge pump;
- wherein said clamping voltage is less than or equal to said maximum tolerable voltage, and said clamping voltage is larger than said internal voltage.

* * * * *